United States Patent
Tamura et al.

(10) Patent No.: US 9,657,128 B2
(45) Date of Patent: *May 23, 2017

(54) THERMOSETTING RESIN COMPOSITION CONTAINING POLYMER HAVING SPECIFIC TERMINAL STRUCTURE

(71) Applicant: NISSAN CHEMICAL INDUSTRIES, LTD., Tokyo (JP)

(72) Inventors: Mamoru Tamura, Toyama (JP); Takuya Ohashi, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/900,489

(22) PCT Filed: Jun. 4, 2014

(86) PCT No.: PCT/JP2014/064862
§ 371 (c)(1),
(2) Date: Dec. 21, 2015

(87) PCT Pub. No.: WO2014/203735
PCT Pub. Date: Dec. 24, 2014

(65) Prior Publication Data
US 2016/0152759 A1   Jun. 2, 2016

(30) Foreign Application Priority Data
Jun. 21, 2013 (JP) .................................. 2013-130934

(51) Int. Cl.
| | |
|---|---|
| C08G 73/06 | (2006.01) |
| C08G 14/06 | (2006.01) |
| C09J 179/02 | (2006.01) |
| C08G 14/12 | (2006.01) |
| C08L 61/34 | (2006.01) |
| C08L 63/00 | (2006.01) |
| C08K 3/00 | (2006.01) |
| C09J 161/34 | (2006.01) |

(Continued)

(52) U.S. Cl.
CPC ............. *C08G 14/06* (2013.01); *C08G 14/12* (2013.01); *C08G 73/06* (2013.01); *C08K 3/0033* (2013.01); *C08L 61/34* (2013.01); *C08L 63/00* (2013.01); *C09J 161/34* (2013.01); *C09J 179/02* (2013.01); *H01L 23/295* (2013.01); *H01L 23/296* (2013.01); *H01L 23/3142* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 8,349,992 B2 * | 1/2013 | Eguchi | ................... C08G 73/06 528/289 |
| 2009/0318658 A1 | 12/2009 | Chiku et al. | |
| 2010/0204433 A1 | 8/2010 | Eguchi et al. | |

(Continued)

FOREIGN PATENT DOCUMENTS

| | | |
|---|---|---|
| JP | 2008-201998 A | 9/2008 |
| JP | 2008-291070 A | 12/2008 |

(Continued)

OTHER PUBLICATIONS

Jul. 8, 2014 Search Report issued in International Patent Application No. PCT/JP2014/064862.

(Continued)

*Primary Examiner* — Vickey Nerangis
(74) *Attorney, Agent, or Firm* — Oliff PLC

(57) ABSTRACT

Novel thermosetting resin composition is provided. A thermosetting resin composition containing a polymer having a repeating structural unit of the following Formula (1-a):

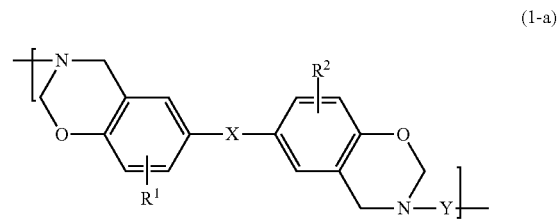

(wherein each of $R^1$ and $R^2$ is independently a hydrogen atom, a $C_{1-4}$ alkyl group, phenyl group, or a $C_{3-6}$ cyclic alkyl group, X is a single bond or a divalent organic group, and Y is a divalent organic group), and a terminal structure of the following Formula (1-b):

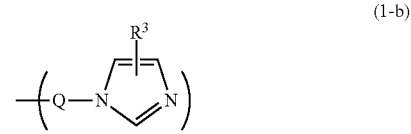

(wherein Q is a $C_{1-5}$ alkylene group, phenylene group in which at least one hydrogen atom may be substituted by a halogen atom, or a 5- or 6-membered divalent saturated heterocyclic group containing at least one nitrogen atom, and $R^3$ is a hydrogen atom or methyl group).

15 Claims, No Drawings

(51) Int. Cl.
*H01L 23/29* (2006.01)
*H01L 23/31* (2006.01)

(56) References Cited

U.S. PATENT DOCUMENTS

2012/0010202 A1\* 1/2012 Taden ................. C07D 265/16
                                                    514/230.5
2012/0172569 A1   7/2012 Katagiri et al.

FOREIGN PATENT DOCUMENTS

| JP | 2009-242669 A | 10/2009 |
| JP | 2009-256650 A | 11/2009 |
| JP | 4887850 B2 | 2/2012 |
| JP | 4931079 B2 | 5/2012 |
| WO | 2007/129640 A1 | 11/2007 |
| WO | 2009/008468 A1 | 1/2009 |
| WO | 2010/032729 A1 | 3/2010 |
| WO | 2011040459 A1 | 4/2011 |

OTHER PUBLICATIONS

Jul. 8, 2014 Written Opinion issued in International Patent Application No. PCT/JP2014/064862.

\* cited by examiner

THERMOSETTING RESIN COMPOSITION CONTAINING POLYMER HAVING SPECIFIC TERMINAL STRUCTURE

TECHNICAL FIELD

The present invention relates to a novel thermosetting resin composition containing a polymer, a molded body and a cured product obtained from the thermosetting resin composition, and an adhesive composition that allows bonding of substances to be layered or an underfill composition used in flip chip bonding in a process of producing a semiconductor device typified by an IC chip.

BACKGROUND ART

In recent years, the higher integration of semiconductor devices has been required along with enhancement in the performance and miniaturization of electronic devices such as cell phones and IC cards. As a procedure for higher integration, the finer pattern of semiconductor devices themselves, and a stack structure in which semiconductor elements are stacked longitudinally have been investigated. In production of the stack structure, an adhesive is used for junction between the semiconductor elements.

In the production of the stack structure, flip chip bonding has been known as a method of mounting an IC chip on a substrate. This is a method in which a plurality of bumps (projected terminals) are provided on the IC chip and the bumps are electrically connected to electrode terminals on the substrate. An underfill agent is used to fill a gap between the substrate and the IC chip and protect the IC chip against moisture and an exterior stress. As the underfill agent, a composition containing an epoxy resin has been used (e.g., Patent Documents 1 and 2). Conventionally, a method has been mainly used in which the underfill agent is injected after the substrate and the IC chip are connected using the bumps (post-applying underfilling), and then thermally cured. However, miniaturization of the bumps, a decrease in pitch, and an increase in the size of the IC chip make post-applying of the underfill agent difficult. As a countermeasure, pre-applying underfilling will be mainly employed in the future in which before the wafer is diced the underfill agent is previously formed on a wafer with bumps, and then diced IC chips are used for flip chip bonding.

As an adhesive for bonding a semiconductor element, an adhesive composition containing an epoxy resin has been known (e.g., Patent Document 3).

A method for producing a semiconductor device of a wafer-on-wafer (WOW) structure has been known as another stack structure (e.g., Patent Document 4).

A thermosetting resin composition containing a compound having an aromatic benzoxazine ring in a main chain has been known (e.g., Patent Documents 5 and 6). A benzoxazine resin has been also known to have excellent heat resistance and electrical characteristics.

PRIOR ART DOCUMENTS

Patent Documents

Patent Document 1: Japanese Patent No. 4887850 (JP 4887850 B2)
Patent Document 2: Japanese Patent No. 4931079 (JP 4931079 B2)
Patent Document 3: Japanese Patent Application Publication No. 2008-201998 (JP 2008-201998 A)
Patent Document 4: International Publication No. 2010/032729 (WO 2010/032729)
Patent Document 5: International Publication No. 2007/129640 (WO 2007/129640)
Patent Document 6: International Publication No. 2009/008468 (WO 2009/008468)

SUMMARY OF THE INVENTION

Problem to be Solved by the Invention

In the flip chip bonding described above, bumps are connected readily after bonding by an underfill agent. Therefore, the conventional adhesive described in Patent Document 3 makes it difficult to prevent the generation of voids. This is because the adhesive is momentarily exposed to high temperature in an uncured state.

The wafer-on-wafer (WOW) structure described in Patent Document 4 requires adhesion between wafers without generation of voids. Therefore, the WOW structure makes it difficult to employ a low molecular weight component that causes the generation of voids and a component that has low heat resistance and is decomposed.

The thermosetting resin composition containing a compound having an aromatic benzoxazine ring in a main chain described in Patent Documents 5 and 6 has low crosslink density and high linear expansion coefficient at a temperature equal to or higher than the glass transition point. Therefore, there is a concern of reduction in reliability caused by occurrence of cracks and peeling due to thermal history.

As a known technique, a technique of mixing an epoxy resin in a benzoxazine resin to enhance the crosslink density has been known. However, a crosslinking reaction of the mixed resin is slow, and sufficient crosslink density is not obtained. As a countermeasure, a technique of adding an epoxy resin-curing agent, which is typified by an imidazole-based compound, has been widely known. However, since the epoxy resin-curing agent has low heat resistance, there is a concern of reduction in reliability caused by generation of voids.

The present invention is made based on the circumstances, and it is an object of the present invention to provide a thermosetting resin composition that has high heat resistance and excellent electrical characteristics and promotes curing of an epoxy resin, a molded body and a cured product obtained from the thermosetting resin composition, and a thermosetting adhesive composition or an underfill composition.

Means for Solving the Problems

The present invention is a thermosetting resin composition containing a polymer having a repeating structural unit of the following Formula (1-a):

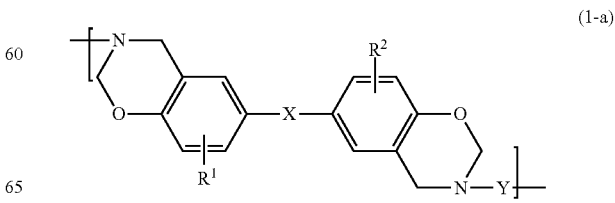

(wherein each of $R^1$ and $R^2$ is independently a hydrogen atom, a $C_{1-4}$ alkyl group, phenyl group, or a $C_{3-6}$ cyclic alkyl group, X is a single bond or a divalent organic group, and Y is a divalent organic group), and a terminal structure of the following Formula (1-b):

(1-b)

(wherein Q is a $C_{1-5}$ alkylene group, phenylene group in which at least one hydrogen atom may be substituted by a halogen atom, or a 5- or 6-membered divalent saturated heterocyclic group containing at least one nitrogen atom, and $R^3$ is a hydrogen atom or methyl group).

If the ratio of a terminal that has the terminal structure of Formula (1-b) in the polymer is defined as a ratio of the amount by mole of an imidazole compound consumed for formation of the terminal structure to the amount by mole of a diamine compound or a bisphenol compound that is a raw material compound (monomer) for the polymer, the ratio is, for example, 1% by mole to 100% by mole, preferably 1% by mole to 50% by mole, and more preferably 5% by mole to 30% by mole.

When both terminals of the polymer have the terminal structure of Formula (1-b), the polymer is represented by the following Formula (1):

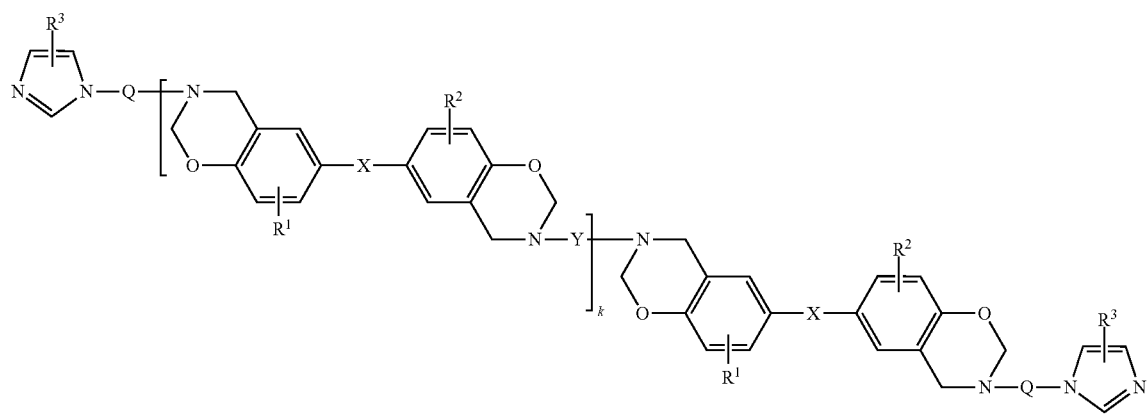

(1)

(wherein $R^1$, $R^2$, $R^3$, X, and Y are the same as the definitions described in Formula (1-a), Q is the same as the definition described in Formula (1-b), and k is an integer of 1 to 200).

When in Formula (1-b), Q is a 5- or 6-membered divalent saturated heterocyclic group containing at least one nitrogen atom, examples of the saturated heterocyclic group include a piperazine ring, an imidazolidine ring, and a pyrazolidine ring.

In Formula (1-b), when Q is a $C_{1-5}$ alkylene group and the number of carbon atoms in the group is 3 to 5, the alkylene group is not limited to a linear group and may be branched.

In Formula (1-a), X is a divalent organic group containing a $C_{1-6}$ alkylene group in which at least one hydrogen atom may be substituted by a halogen atom, a cyclic alkylene group, an arylene group in which at least one hydrogen atom may be substituted by a halogen atom, a sulfonyl group, a carbonyl group, a —O— group, or a —COO— group.

In Formula (1-a), X is, for example, a divalent organic group of the following Formula (2):

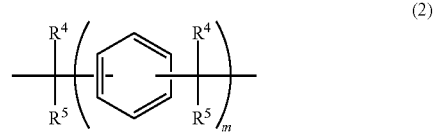

(2)

(wherein each of $R^4$ and $R^5$ is independently a hydrogen atom or methyl group in which at least one hydrogen atom may be substituted by a halogen atom, and m is 0 or 1).

For example, the divalent organic group of Formula (2) is represented by the following Formula (2-a) or Formula (2-b).

(2-a)

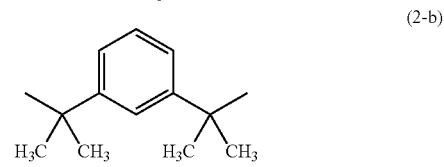

(2-b)

In Formula (1-a), Y is, for example, a divalent organic group of the following Formula (3) or Formula (4):

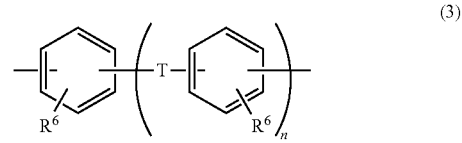

(3)

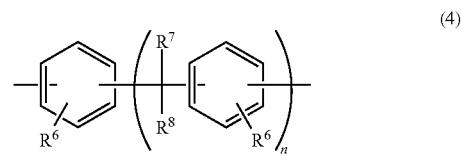

(4)

(wherein T is a single bond, a sulfonyl group, or a —O— group, each of $R^7$ and $R^8$ is independently a hydrogen atom or methyl group in which at least one hydrogen atom may be substituted by a halogen atom, two $R^6$s are each independently a hydrogen atom, methyl group, ethyl group, or methoxy group, and n is 0 or 1).

For example, the divalent organic group of Formula (3) or Formula (4) is represented by the following Formula (3-a), Formula (4-a), or Formula (4-b).

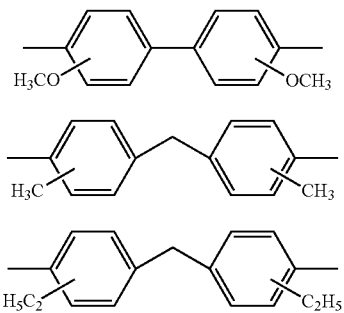

For example, the polymer has a weight average molecular weight of 1,000 to 100,000.

The thermosetting resin composition of the present invention may further contain at least one of an epoxy resin, a phenolic resin, a solvent, a silane coupling agent, and an inorganic filler.

For example, the thermosetting resin composition of the present invention is an adhesive composition or an underfill composition.

Effects of the Invention

The thermosetting resin composition of the present invention may be cured at temperature as relatively low as 200° C. or lower, and promote a curing reaction of an epoxy resin. A film formed from the thermosetting resin composition of the present invention has good adhesion properties without generation of voids, is unlikely to be peeled after adhesion, and has excellent heat resistance and good electrical characteristics. When the thermosetting resin composition of the present invention is mixed in an epoxy resin, the crosslink density is enhanced. Therefore, the thermosetting resin composition of the present invention is useful as an epoxy curing accelerator, an adhesive, or an underfill agent.

MODES FOR CARRYING OUT THE INVENTION

For example, a polymer in a thermosetting resin composition of the present invention is obtained as follows. A reaction is caused for a predetermined time while a solution is heated in which a bisphenol compound, a diamine compound, and an aldehyde compound are dissolved in a solvent, to obtain a solution containing a polymer. To the solution, an imidazole compound having an amino group or a hydroxyphenyl group in the molecule, and an aldehyde compound are added, and the mixture is subjected to a reaction for a predetermined time under heating.

The bisphenol compound herein is a compound having two hydroxyphenyl groups in the molecule. Examples thereof include 2,2-bis(4-hydroxyphenyl)propane [bisphenol A], bis(4-hydroxyphenyl)sulfone [bisphenol S], 2,2-bis(4-hydroxyphenyl)hexafluoropropane [bisphenol AF], bis(4-hydroxyphenyl)methane [bisphenol F], 1,1-bis(4-hydroxyphenyl)ethane [bisphenol E], 1,3-bis[2-(4-hydroxyphenyl)-2-propyl]benzene [bisphenol M], 1,4-bis[2-(4-hydroxyphenyl)-2-propyl]benzene [bisphenol P], 2,2'-bis(4-hydroxy-3-methylphenyl)propane, phenol phthalein, 4,4'-biphenol, 1,1-bis(4-hydroxyphenyl)cyclohexane, 1,1-bis(4-hydroxy-3-methylphenyl)cyclohexane, 9,9-bis(4-hydroxyphenyl)fluorene, 9,9-bis(4-hydroxy-3-methylphenyl)fluorene, 1,1-bis(3-cyclohexyl-4-hydroxyphenyl)cyclohexane, 2,2-bis(3-cyclohexyl-4-hydroxyphenyl)propane, and 2,2-bis(2-hydroxy-5-biphenyl)propane.

Examples of the diamine compound include 4,4'-diamino-3,3'-dimethyldiphenylmethane, 4,4'-diamino-3,3'-diethyldiphenylmethane, 4,4'-diamino-3,3',5,5'-tetramethyldiphenylmethane, o-dianisidine, o-phenylenediamine, m-phenylenediamine, p-phenylenediamine, bis[4-(3-aminophenoxy)phenyl]sulfone, 3,3'-sulfonyldianyline, and 4,4'-sulfonyldianyline.

Examples of the aldehyde compounds include paraformaldehyde and formaldehyde.

Examples of the solvent of dissolving the compound include toluene, xylene, dioxane, tetrahydrofuran, chloroform, dichloromethane, cyclohexanone, cyclopentanone, methyl ethyl ketone, and N-methyl-2-pyrrolidone.

Examples of the imidazole compound having an amino group or a hydroxyphenyl group in the molecule include 1-(3-aminopropyl)imidazole, 4-(2-methyl-1-imidazolyl)phenylamine, 4-(1-imidazolyl)aniline, 3-chloro-4-(1-imidazolyl)aniline, and p-(1-imidazolyl)phenol.

When the thermosetting resin composition of the present invention contains the polymer and an epoxy resin, a compound having at least one epoxy group in the molecule can be used as the epoxy resin. Examples of the epoxy resin include 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidyl aniline), trimethylol ethane triglycidyl ether, triglycidyl-p-aminophenol, tetraglycidyl methaxylene diamine, tetraglycidyl diaminodiphenylmethane, tetraglycidyl-1,3-bis(aminomethyl)cyclohexane, bisphenol-A-diglycidyl ether, bisphenol-S-diglycidyl ether, pentaerythritol tetraglycidyl ether, resorcinol diglycidyl ether, diglycidyl phthalate ester, neopentyl glycol diglycidyl ether, polypropylene glycol diglycidyl ether, tetrabromobisphenol-A-diglycidyl ether, bisphenol hexafluoroacetone diglycidyl ether, pentaerythritol diglycidyl ether, tris-(2,3-epoxypropyl)isocyanurate, monoallyl diglycidyl isocyanurate, diglycerol polyglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylol perfluorohexane diglycidyl ether, 4,4'-bis(2,3-epoxypropoxyperfluoroisopropyl)diphenyl ether, 2,2-bis(4-glycidyloxyphenyl)propane, 3',4'-epoxycyclohexylmethyl-3,4-epoxycyclohexane carboxylate, 3,4-epoxycyclohexyloxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis(3,4-epoxycyclohexylmethyl) adipate, bis(2,3-epoxycyclopentyl) ether, ε-caprolactone-modified tetra(3,4- epoxycyclohexylmethyl)butane tetracarboxylate, ε-caprolactone-modified 3',4'-epoxycyclohexylmethyl-3,4-epoxycyclohexane carboxylate, 1,2-epoxy-4-vinylcyclohexane, 1,2-epoxy-4-(2-methyloxiranyl)-1-methylcyclohexane, 1,2-epoxy-4-(2-oxiranyl)cyclohexane adduct of 2,2-bis(hydroxymethyl)-1-butanol, a naphthalene type epoxy resin, epoxidized polybutadiene, 3,4-epoxycyclohexylmethyl methacrylate, polyglycidyl methacrylate, an epoxidized compound of styrene-butadiene block copolymer, and a polynuclear phenol glycidyl ether derivative resin.

One of the epoxy resins may be used alone or two or more thereof may be used in combination. The epoxy resin may be used in an amount of 1% by mass to 80% by mass, 5% by mass to 60% by mass, or 10% by mass to 50% by mass relative to the polymer contained in the thermosetting resin composition of the present invention.

When the thermosetting resin composition of the present invention contains a solvent, the solvent is not particularly limited as long as it is an organic solvent usable in a process of producing a semiconductor device. As such an organic solvent, a ketone such as cyclohexanone, cyclopentanone, tetrahydrofuran, methyl isoamyl ketone, 2-butanone, or 2-heptanone; a polyhydric alcohol such as ethylene glycol, ethylene glycol monoacetate, diethylene glycol, diethylene glycol monoacetate, propylene glycol, propylene glycol monoacetate, dipropylene glycol, dipropylene glycol monoacetate, or monomethyl ether, monoethyl ether, monopropyl ether, monobutyl ether, monophenyl ether thereof, or a derivative thereof; a cyclic ether such as dioxane; or an ester such as methyl lactate, ethyl lactate, methyl acetate, ethyl acetate, butyl acetate, methyl pyruvate, ethyl pyruvate, methyl methoxypropionate, or ethyl ethoxypropionate is preferably used. One of the organic solvents may be used alone or a mixture of two or more thereof may be used. When a component other than the organic solvent in the thermosetting resin composition of the present invention is a solid content, the ratio of the solid content to the composition is, for example, 1% by mass to 70% by mass.

The thermosetting resin composition of the present invention may further contain an additive such as a phenolic resin, an inorganic filler, a silane coupling agent, a surfactant, a rheology controlling agent, and a crosslinker, if necessary.

Examples of the phenolic resin include, but not particularly limited to, novolacs of phenol and aldehyde such as phenol novolac and orthocresol novolac.

Examples of the inorganic filler include sols of silica, aluminum nitride, boron nitride, zirconia, and alumina that have a particle diameter of 1 nm or more and 700 nm or less. Particles in the inorganic filler may be surface-treated with a silane coupling agent described below.

Examples of the silane coupling agent include vinyltrimethoxysilane, vinyltriethoxysilane, 3-methacryloxypropyltriethoxysilane, 3-methacryloxypropyltrimethoxysilane, 3-glycidylpropyltrimethoxysilane, 3-glycidylpropyltriethoxysilane, 2-(3,4-epoxycyclohexyl)propyltrimethoxysilane, 2-(3,4-epoxycyclohexyl)propyltriethoxysilane, 2-(3,4-epoxycyclohexyl)ethyltrimethoxysilane, 2-(3,4-epoxycyclohexyl)ethyltriethoxysilane, 2-(3,4-epoxycyclohexyl)methyltrimethoxysilane, 2-(3,4-epoxycyclohexyl)methyltriethoxysilane, 3-aminopropyltriethoxysilane, 3-aminopropyltrimethoxysilane, 3-phenylaminopropyltrimethoxysilane, 3-phenylaminopropyltriethoxysilane, 3-triethoxysilylpropyl succinic anhydride, 3-trimethoxysilylpropyl succinic anhydride, and N-(3-triethoxysilylpropyl)-4,5-dihydroimidazole.

Examples of the rheology controlling agent include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop (registered trademark) EF301, EF303, and EF352 (available from Mitsubishi Materials Electronic Chemicals Co., Ltd.), MEGAFACE (registered trademark) F171, F173, R30, R30N, R40, and R40-LM (available from DIC Corporation), Fluorad FC430 and FC431 (available from Sumitomo 3M, Ltd.), and Asahi Guard (registered trademark) AG710, and Surflon S-382, SC101, SC102, SC103, SC104, SC105, and SC106 (available from Asahi Glass Co., Ltd.), and organosiloxane polymer KP341 (available from Shin-Etsu Chemical Co., Ltd.). One of the surfactants may be added alone or two or more thereof may be added in combination.

The thermosetting resin composition of the present invention does not always contain the crosslinker, but if used, examples of the crosslinker include nitrogen-containing compounds in which a nitrogen atom is substituted by an alkoxymethyl group such as a methoxymethyl group, an ethocymethyl group, a butoxymethyl group, or a hexyloxymethyl group, or a hydroxymethyl group. As the crosslinker, a phenol group-containing compound, an allyl group-containing compound, an allyl group-containing polymer, an isocyanate group-containing compound, or an isocyanate group-containing polymer may be used.

Examples of the nitrogen-containing compound include nitrogen-containing compounds such as hexamethoxy methyl melamine, tetramethoxymethyl benzoguanamine, 1,3,4,6-tetrakis(butoxymethyl) glycoluril, 1,3,4,6-tetrakis (hydroxymethyl) glycoluril, 1,3-bis(hydroxymethyl)urea, 1,1,3,3-tetrakis(butoxymethyl)urea, 1,1,3,3-tetrakis (methoxymethyl)urea, 1,3-bis(hydroxymethyl)-4,5-dihydroxy-2-imidazolinone, and 1,3-bis(methoxymethyl)-4,5-dihydroxy-2-imidazolinone. Examples of the crosslinker include commercially available compounds such as a methoxymethyl-type melamine compound available from Nihon Cytec Industries Inc. (trade name: CYMEL (registered trademark) 300, 301, 303, and 350), a butoxymethyl-type melamine compound (trade name: MYCOAT (registered trademark) 506 and 508), a glycoluril compound (trade name: CYMEL (registered trademark) 1170 and POWDERLINK (registered trademark) 1174), a methylated urea resin (trade name: UFR65), a butylated urea resin (trade name: UFR300, U-VAN10S60, U-VAN10R, and U-VAN11HV), and a urea-formaldehyde-based resin available from DIC Corporation (highly condensed, trade name: BECKAMINE (registered trademark) J-300S, P-955, and N).

One the crosslinkers may be used alone or two or more of the compounds may be used in combination. The crosslinker may be used in an amount of 1% by mass to 50% by mass, 8% by mass to 40% by mass, or 15% by mass to 30% by mass relative to the polymer contained in the thermosetting resin composition of the present invention.

The thermosetting resin composition of the present invention may contain a crosslinking catalyst in addition to the crosslinker. Use of the crosslinking catalyst promotes a reaction of the crosslinker. Examples of the crosslinking catalyst include p-toluenesulfonic acid, trifluoromethanesulfonic acid, methanesulfonic acid, pyridinium p-toluenesulfonate, salicylic acid, camphorsulfonic acid, 5-sulfosalicylic acid, citric acid, benzoic acid, hydroxybenzoic acid, 4-chlorobenzenesulfonic acid, 4-hydroxybenzenesulfonic acid, benzenedisulfonic acid, and 1-naphthalenesulfonic acid. One of the crosslinking catalysts may be used alone or two or more thereof may be used in combination. The crosslinking catalyst may be used in an amount of 0.01% by mass to 10% by mass, 0.05% by mass to 8% by mass, 0.1% by mass to 5% by mass, 0.3% by mass to 3% by mass, or 0.5% by mass to 1% by mass relative to the polymer contained in the thermosetting resin composition of the present invention.

The thermosetting resin composition of the present invention can be used as an adhesive composition or an underfill composition. When the thermosetting resin composition of the present invention is used as an adhesive composition or an underfill composition, a commonly used additive such as an additive having a miscibility, for example, an additional resin to improve the performance of an additive, a tackifier, a plasticizer, an adhesion aid, a stabilizer, a colorant, an antifoaming material, and flux may be added as long as substantial properties in the present invention are not impaired.

As the additional resin (polymer) to improve the performance of an adhesive, an addition polymerization polymer or a condensation polymerization polymer such as polyester, polystyrene, polyimide, acrylic polymer, methacrylic polymer, polyvinylether, phenol novolac, naphthol novolac, polyether, polyamide, or polycarbonate can be used. A polymer having an aromatic ring such as a benzene ring, a naphthalene ring, an anthracene ring, a triazine ring, a quinoline ring, or a quinoxaline ring is preferably used. Examples of the polymer having a triazine ring include polyesters having a structural unit of the following Formula (5):

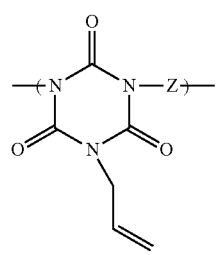

(5)

(wherein Z is a divalent organic group).

Examples of the additional resin (polymer) include addition polymerization polymers containing as the structural unit an addition polymerizable monomers such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenyl maleimide, and condensation polymerization polymers such as phenol novolac and naphthol novolac. Furthermore, a polymer without an aromatic ring can be used as the additional resin (polymer). Examples of the polymer include addition polymerization polymers containing as the structural unit only addition polymerizable monomers without an aromatic ring such as alkyl acrylate, alkyl methacrylate, vinyl ether, alkyl vinyl ether, acrylonitrile, maleimide, N-alkylmaleimide, and maleic anhydride. When the addition polymerization polymer is used as the additional resin (polymer), the polymer may be a homopolymer or a copolymer.

The additional resin (polymer) to be added to an adhesive composition or an underfill composition that is the thermosetting resin composition of the present invention has a weight average molecular weight of 1,000 to 1,000,000, 3,000 to 300,000, 5,000 to 200,000, or 10,000 to 100,000. When the adhesive composition or the underfill composition of the present invention contains the additional resin (polymer), the content thereof in the solid content is, for example, 40% by mass or less, 20% by mass or less, or 1 to 19% by mass.

The tackifier is added to control the elastic modulus, viscosity, and the surface state. It is preferable that the kind of the tackifier be determined in consideration of viscosity. Examples of the tackifier include one or a combination of two or more selected from an aliphatic petroleum resin, an aromatic petroleum resin, an aliphatic/aromatic copolymer-based petroleum resin, an alicyclic hydrofined petroleum resin, an alkyl phenol resin, a xylene resin, a coumarone-indene resin, a terpene resin, a terpene-phenolic resin, an aromatic modified terpene resin, a hydrogenated terpene resin, a rosin-type resin, a hydrogenated rosin-type resin, a disproportionated rosin-type resin, a dimerized rosin-type resin, and an esterified rosin-type resin. The tackifier may be contained in an amount of 100% by mass or less or 50% by mass or less relative to the polymer contained in the adhesive composition or the underfill composition of the present invention.

EXAMPLES

Hereinafter, the present invention will be described in more detail on the basis of Examples, and the present invention is not limited to these Examples.

In gel permeation chromatography (GPC) of polymers obtained in Synthesis Examples described below, the following device is used, and the measurement condition is as follows.
Device: integrated high-performance GPC system HLC-8220GPC manufactured by TOSOH CORPORATION
Column: KF-G and KF-804L
Column temperature: 40° C.
Solvent: tetrahydrofuran (THF)
Flow rate: 1.0 mL/min
Standard sample: polystyrene
Detector: RI Synthesis Example 1

45.79 g of 4,4'-diamino-3,3'-diethyldiphenylmethane (KAYAHARD A-A available from NIPPON KAYAKU Co., Ltd.), 69.29 g of bisphenol M (available from MITSUI FINE CHEMICALS, Inc.), 22.81 g of paraformaldehyde (available from Tokyo Chemical Industry Co., Ltd.), and 4.05 g of triethylamine were dissolved in 331.18 g of N-methyl-2-pyrrolidone. Purging with nitrogen was carried out, and a reaction was caused at 90° C. for 20 hours to obtain a solution containing a polymer. Subsequently, the solution was allowed to cool to room temperature. To the resultant solution, 6.26 g of 1-(3-aminopropyl)imidazole (available from Tokyo Chemical Industry Co., Ltd.), 6.34 g of paraformaldehyde (available from Tokyo Chemical Industry Co., Ltd.), 0.40 g of triethylamine, and 30.33 g of N-methyl-2- pyrrolidone were added. Purging with nitrogen was carried out, and a reaction was caused at 90° C. for 8 hours. To the resultant solution, methanol was added dropwise, resulting in reprecipitation. The resultant precipitate was then collected by filtration with suction using a Buchner funnel, and washed with methanol twice. The resulting powder was dried for 12 hours by a reduced-pressure dryer to obtain a polymer. The obtained polymer was analyzed by GPC. The weight average molecular weight in terms of standard polystyrene was 4,000. The resulting polymer has a repeating structural unit of the following Formula (6-a) and a terminal structural of the following Formula (6-b). The ratio of a terminal that has the terminal structure of the following Formula (6-b) in the polymer is presumed to be 20% by mole relative to the amount by mole of bisphenol M as a raw material compound.

NIPPON KAYAKU Co., Ltd.), 69.30 g of bisphenol M (available from MITSUI FINE CHEMICALS, Inc.), 22.87 g of paraformaldehyde (available from Tokyo Chemical Industry Co., Ltd.), and 4.05 g of triethylamine were dissolved in 320.48 g of N-methyl-2-pyrrolidone. Purging with nitrogen was then carried out, and a reaction was caused at 90° C. for 20 hours to obtain a solution containing a polymer. Subsequently, the resultant solution was added dropwise to methanol, resulting in reprecipitation. The resultant precipitate was then collected by filtration with suction using a Buchner funnel, and washed with methanol twice. The resulting powder was dried for 12 hours by a reduced-pressure dryer to obtain a polymer. The obtained polymer was analyzed by GPC. The weight average molecular weight in terms of standard polystyrene was 9,900. The resulting

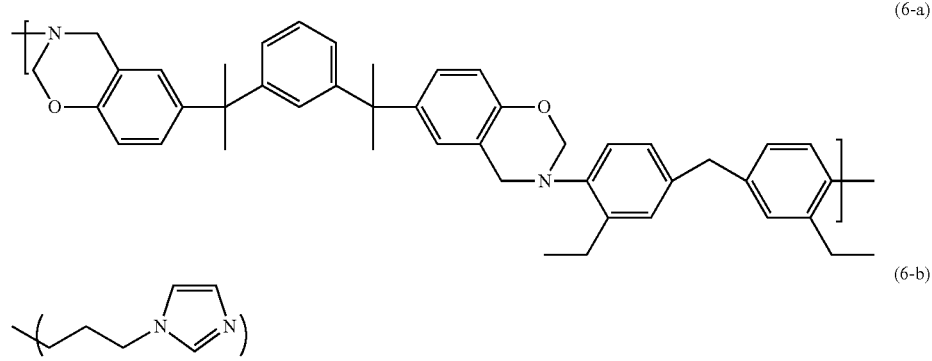

Synthesis Example 2

1.95 g of 1,3-phenylenediamine (available from Tokyo Chemical Industry Co., Ltd.), 41.20 g of 4,4'-diamino-3,3'-diethyldiphenylmethane (KAYAHARD A-A available from polymer is presumed to have a repeating structural unit of the following Formula (6-a), a repeating structural unit of the following Formula (7), and a terminal of the following Formula (8). The polymer does not have a terminal structure containing an imidazole ring of Formula (6-b).

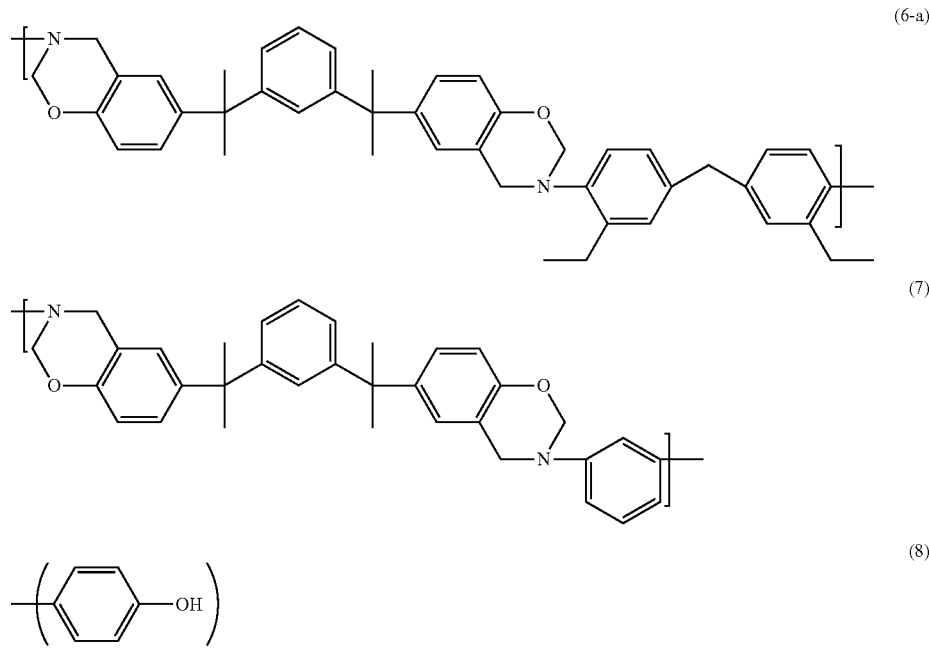

Comparative Example 1

1-Cyanoethyl-2-undecylimidazole (available from Tokyo Chemical Industry Co., Ltd.) as an epoxy resin curing agent was prepared.

Comparative Example 2

2-Ethyl-4-methylimidazole (available from Tokyo Chemical Industry Co., Ltd.) as an epoxy resin curing agent was prepared.

Comparative Example 3

4-Methyl-2-phenylimidazole (available from Tokyo Chemical Industry Co., Ltd.) as an epoxy resin curing agent was prepared.

[Evaluation of Heat Resistance]

The heat resistance of the polymer obtained in Synthesis Example 1 and the imidazole-based epoxy resin curing agents prepared in Comparative Examples 1 to 3 was evaluated from measurement results of temperature (hereinafter abbreviated as 5% by mass weight decrease temperature in the specification) at which a weight decrease of 5% by mass is caused by heating a sample at 10° C./min by TG-DTA (TG/DTA2010SR manufactured by NETZSCH). The measurement results of 5% by mass weight decrease temperature are shown in Table 1 below.

TABLE 1

| | 5% by mass weight decrease temperature (° C.) |
|---|---|
| Synthesis Example 1 | 383 |
| Comparative Example 1 | 231 |
| Comparative Example 2 | 112 |
| Comparative Example 3 | 207 |

The polymer obtained in Synthesis Example 1 has a 5% by mass weight decrease temperature of 383° C., and exhibits higher heat resistance as compared with the imidazole-based epoxy resin curing agents prepared in Comparative Examples 1 to 3.

[Preparation of Thermosetting Resin Composition]

Example 1

10 g of the polymer obtained in Synthesis Example 1 was dissolved in 40 g of tetrahydrofuran, and the mixture was filtered through a microfilter with a pore diameter of 0.2 μm made of polytetrafluoroethylene (hereinafter abbreviated as PTFE in the specification) to prepare a composition containing 20% by mass of solid content.

Example 2

5 g of the polymer obtained in Synthesis Example 1 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Example 3

50 g of the polymer obtained in Synthesis Example 1 was dissolved in 50 g of cyclopentanone, and the mixture was then filtered through a microfilter with a pore diameter of 5.0 μm made of PTFE to prepare a composition containing 50% by mass of solid content.

Example 4

25 g of the polymer obtained in Synthesis Example 1 and 25 g of EPOLEAD GT401 (available from DAICEL CORPORATION) as an epoxy resin were dissolved in 50 g of cyclopentanone, and the mixture was then filtered through a microfilter with a pore diameter of 5.0 μm made of PTFE to prepare a composition containing 50% by mass of solid content.

Example 5

3 g of the polymer obtained in Synthesis Example 1, 2 g of KAYAHARD (available from NIPPON KAYAKU Co., Ltd.) as a phenol novolac resin, 5 g of EPOLEAD GT401 (available from DAICEL CORPORATION) as an epoxy resin, and 2 g of 3-phenylaminopropyltrimethoxysilane (available from Tokyo Chemical Industry Co., Ltd.) were dissolved in 65.5 g of tetrahydrofuran. The mixture was then mixed with 32.5 g of organosilica sol [dispersion solution of silica surface-treated with 3-methacryloxypropyltrimethoxysilane in methyl ethyl ketone, primary particle diameter of silica: 40 nm to 50 nm, solid content: 30.8% by mass, specific gravity (20° C.): 1.007, viscosity (20° C.): 2.5 mPa·s, moisture content: 0.08% by mass] as inorganic fillers, to prepare a composition containing 20% by mass of solid content.

Example 6

3 g of the polymer obtained in Synthesis Example 1, 2 g of KAYAHARD GPH-65 (available from NIPPON KAYAKU Co., Ltd.) as a phenol novolac resin, 5 g of EPOLEAD GT401 (available from DAICEL CORPORATION) as an epoxy resin, and 2 g of 3-phenylaminopropyltrimethoxysilane (available from Tokyo Chemical Industry Co., Ltd.) were dissolved in 22 g of cyclopentanone. The mixture was then mixed with 32.5 g of organosilica sol [dispersion solution of silica surface-treated with 3-methacryloxypropyltrimethoxysilane in methyl ethyl ketone, primary particle diameter of silica: 40 nm to 50 nm, solid content: 30.8% by mass, specific gravity (20° C.): 1.007, viscosity (20° C.): 2.5 mPa·s, moisture content: 0.08% by mass] as inorganic fillers. The mixture was concentrated by an evaporator to prepare a composition containing 50% by mass of solid content.

Comparative Example 4

5 g of the polymer obtained in Synthesis Example 2 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Comparative Example 5

25 g of the polymer obtained in Synthesis Example 2 and 25 g of EPOLEAD GT401 (available from DAICEL COR- PORATION) as an epoxy resin were dissolved in 50 g of cyclopentanone, and the mixture was filtered through a microfilter with a pore diameter of 5.0 μm made of PTFE to prepare a composition containing 50% by mass of solid content.

Comparative Example 6

25 g of the polymer obtained in Synthesis Example 2, 0.5 g of 1-cyanoethyl-2-undecylimidazole in Comparative Example 1, and 25.5 g of EPOLEAD GT401 (available from DAICEL CORPORATION) as an epoxy resin were dissolved in 51.0 g of cyclopentanone, and the mixture was filtered through a microfilter with a pore diameter of 5.0 μm made of PTFE to prepare a composition containing 50% by mass of solid content.

[Evaluation of Curing Properties]

1 g of the composition prepared in each of Examples 1, 2, and 5, and Comparative Example 4 was placed in a metal cup with a diameter of 40 mm, baked at 50° C. for 60 minutes, at 65° C. for 60 minutes, and at 80° C. for 30 minutes, and tetrahydrofuran was evaporated to form a thermosetting resin film. Subsequently, the curing temperature of the resin film was evaluated by increasing the temperature using a rheometer (MCR102 manufactured by Anton Paar GmbH) at 5° C./min. A curing temperature of lower than 190° C. is determined to be ○, and a curing temperature of 190° C. or higher is determined to be x. The curing temperature shown herein is a temperature at which the complex viscosity is 10,000 Pa·s by a curing reaction of the resin film. The results of the curing temperature are shown in Table 2.

TABLE 2

| | Curing properties |
|---|---|
| Example 1 | ○ |
| Example 2 | ○ |
| Example 5 | ○ |
| Comparative Example 4 | X |

In the resin films formed from the compositions prepared in Examples 1, 2, and 5, the curing temperature is lower than that of the resin film formed from the composition prepared in Comparative Example 4. This shows that the thermosetting resin composition of the present invention promotes an epoxy curing reaction.

[Evaluation of Adhesion]

On a silicon wafer of 4 inches, the composition prepared in each of Examples 3, 4, and 6, and Comparative Example 6 was baked at 100° C. for 5 minutes so that the thickness after baking was 15 μm to 25 μm, and baked at 130° C. for 5 minutes, and cyclopentanone was evaporated to form a thermosetting resin film. The silicon wafer having the resin film was bonded to a glass wafer of 4 inches using a bonding device (VJ-300 manufactured by Ayumi Industries Company Limited) under conditions of a degree of vacuum of 10 Pa or less, a temperature of 140° C., and an applied load of 300 kg, and heated at 180° C. for 60 minutes. Thus, the resin was cured. Good adhesion without voids is evaluated to be ○, and adhesion failure with voids is evaluated to be x. The results are shown in Table 3.

[Heat Resistance after Adhesion]

A sample which exhibited good adhesion in the evaluation of adhesion was heated at 200° C. for 5 minutes, and placed on a hot plate of 250° C. The non-occurrence or occurrence of peeling was confirmed. The non-occurrence of peeling even when 1 hour or more elapsed after placing of the sample on the hot plate is evaluated to be ○, and the occurrence of peeling within less than 1 hour is evaluated to be x. The results are shown in Table 3.

TABLE 3

| | Adhesion | Heat Resistance after Adhesion |
|---|---|---|
| Example 3 | ○ | ○ |
| Example 4 | ○ | ○ |
| Example 6 | ○ | ○ |
| Comparative Example 6 | X | — |

The compositions prepared in Examples 3, 4, and 6 have good adhesion and heat resistance after adhesion. On the other hand, the composition prepared in Comparative Example 6 using 1-cyanoethyl-2-undecylimidazole as an existing epoxy resin curing agent has low heat resistance, and voids, which are considered to be caused by sublimation, are generated.

[Evaluation of Physical Properties of Cured Film]

A silicon wafer laminated with aluminum foil was spin-coated with the composition prepared in each of Examples 4 and 6, and Comparative Examples 5 and 6 so that the thickness after baking was 15 μm to 25 μm, and the composition was baked at 100° C. for 5 minutes, and at 130° C. for 5 minutes, and cyclopentanone was evaporated to form a thermosetting resin film layered on the aluminum foil. The thermosetting resin film was then baked at 180° C. for 60 minutes in a nitrogen atmosphere, and cured. The resin film was added to an aqueous 6 mol/L hydrochloric acid solution to dissolve the aluminum foil. Thus, the cured film was obtained. The obtained cured film was cut into a width of 5 mm. The linear expansion coefficient (CTE) at Tg, temperature lower than Tg, and temperature higher than Tg was evaluated by measuring the elongation of the cured film when the temperature was increased at 5° C./min from room temperature to 200° C. by thermal mechanical analysis (TMA) device (TMA4000SA manufactured by NETZSCH). Tg of 140° C. or higher is determined to be ○, and Tg of lower than 140° C. is determined to be x. CTE at a temperature lower than Tg of less than 70 ppm/° C. is determined to be ○, and CTE at a temperature lower than Tg of 70 ppm/° C. or more is determined to be x. CTE at a temperature higher than Tg of less than 1,000 ppm/° C. is determined to be ○, and CTE at a temperature higher than Tg of 1,000 ppm/° C. or more is determined to be x. Herein, Tg is a temperature at which the elongation amount of the cured resin is inflected. The measurement results are shown in Table 4.

TABLE 4

| | Tg | CTE at temperature lower than Tg | CTE at temperature higher than Tg |
|---|---|---|---|
| Example 4 | ○ | ○ | ○ |
| Example 6 | ○ | ○ | ○ |
| Comparative Example 5 | X | X | X |
| Comparative Example 6 | X | ○ | ○ |

For the cured films obtained from the compositions prepared in Examples 4 and 6, crosslinking of epoxy resin sufficiently proceeds, and good cured resin properties are obtained. In contrast, for the cured films obtained from the compositions prepared in Comparative Examples 5 to 6, property failure is caused, which is likely to be caused by insufficient crosslinking of epoxy resin.

[Evaluation of Electrical Characteristics]

The composition prepared in each of Examples 3, 4, and 6 was diluted with cyclopentanone, the mixture was applied to a silicon wafer using a spin coater, baked on a hot plate at 100° C. for 2 minutes and at 130° C. for 2 minutes, baked at 180° C. for 60 minutes in an oven purged with nitrogen to form a cured film with a thickness of 500 nm. A leak current density and a dielectric constant when an electric field strength of 1 MV/cm was applied to the prepared sample by a CVmap 92B (manufactured by Four Dimensions) were measured. The results are shown in Table 5.

TABLE 5

|  | Dielectric constant | Leak current density (A/cm$^2$) |
| --- | --- | --- |
| Example 3 | 2.9 | $0.5 \times 10^{-9}$ |
| Example 4 | 3.3 | $2.5 \times 10^{-9}$ |
| Example 6 | 3.5 | $0.9 \times 10^{-9}$ |

This shows that the cured films obtained from the compositions prepared in Examples 3, 4, and 6 have good electrical characteristics for an adhesive or an underfill application.

The invention claimed is:

1. A thermosetting resin composition containing a polymer having a repeating structural unit of the following Formula (1-a):

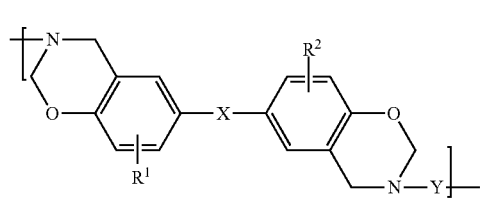

(1-a)

(wherein each of $R^1$ and $R^2$ is independently a hydrogen atom, a $C_{1-4}$ alkyl group, phenyl group, or a $C_{3-6}$ cyclic alkyl group, X is a single bond or a divalent organic group, and Y is a divalent organic group), and a terminal structure of the following Formula (1-b):

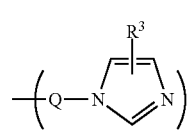

(1-b)

(wherein Q is a $C_{1-5}$ alkylene group, phenylene group in which at least one hydrogen atom may be substituted by a halogen atom, or a 5- or 6-membered divalent saturated heterocyclic group containing at least one nitrogen atom, and $R^3$ is a hydrogen atom or methyl group).

2. The thermosetting resin composition according to claim 1, wherein if the ratio of a terminal that has the terminal structure of Formula (1-b) in the polymer is defined as a ratio of the amount by mole of an imidazole compound consumed for formation of the terminal structure to the amount by mole of a diamine compound or a bisphenol compound that is a raw material compound for the polymer, the ratio is 1% by mole to 100% by mole.

3. The thermosetting resin composition according to claim 1, wherein Q in the Formula (1-b) is a $C_{1-5}$ alkylene group.

4. The thermosetting resin composition according to claim 1, wherein in Formula (1-a), X is a divalent organic group containing a $C_{1-6}$ alkylene group in which at least one hydrogen atom may be substituted by a halogen atom, a cyclic alkylene group, an arylene group in which at least one hydrogen atom may be substituted by a halogen atom, a sulfonyl group, a carbonyl group, a —O— group, or a —COO— group.

5. The thermosetting resin composition according to claim 1, wherein in Formula (1-a), X is a divalent organic group of the following Formula (2):

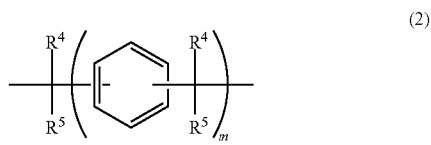

(2)

(wherein each of $R^4$ and $R^5$ is independently a hydrogen atom or methyl group in which at least one hydrogen atom may be substituted by a halogen atom, and m is 0 or 1).

6. The thermosetting resin composition according to claim 5, wherein the divalent organic group of Formula (2) is represented by the following Formula (2-a) or Formula (2-b):

(2-a)

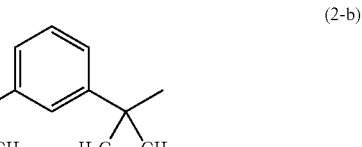

(2-b)

7. The thermosetting resin composition according to claim 1, wherein in Formula (1-a), Y is a divalent organic group of the following Formula (3) or Formula (4):

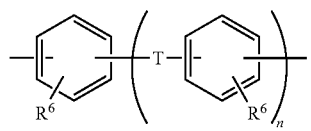

(3)

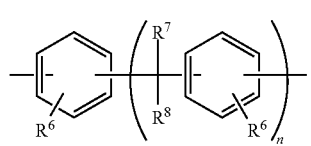

(4)

(wherein T is a single bond, a sulfonyl group, or a —O— group, each of $R^7$ and $R^8$ is independently a hydrogen atom or methyl group in which at least one hydrogen atom may be substituted by a halogen atom, two $R^6$s are each independently a hydrogen atom, methyl group, ethyl group, or methoxy group, and n is 0 or 1).

8. The thermosetting resin composition according to claim 7, wherein the divalent organic group of Formula (3) or Formula (4) is represented by the following Formula (3-a), Formula (4-a), or Formula (4-b):

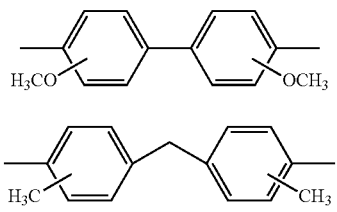

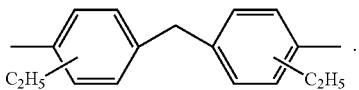

9. The thermosetting resin composition according to claim 1, wherein the polymer has a weight average molecular weight of 1,000 to 100,000.

10. The thermosetting resin composition according to claim 1, further comprising an epoxy resin.

11. The thermosetting resin composition according to claim 1, further comprising a phenolic resin.

12. The thermosetting resin composition according to claim 1, further comprising a solvent.

13. The thermosetting resin composition according to claim 1, further comprising a silane coupling agent.

14. The thermosetting resin composition according to claim 1, further comprising an inorganic filler.

15. The thermosetting resin composition according to claim 1 which is an adhesive composition or an underfill composition.

* * * * *